(12) United States Patent
Kato et al.

(10) Patent No.: US 6,790,581 B2
(45) Date of Patent: Sep. 14, 2004

(54) HYBRID COMPOUND, RESIST, AND PATTERNING PROCESS

(75) Inventors: Hideto Kato, Gunma-ken (JP); Tomoyoshi Furihata, Gunma-ken (JP)

(73) Assignee: Shin-Etsu Chemical Company, Limited, Tokyo (JP)

( * ) Notice: Subject to any disclaimer, the term of this patent is extended or adjusted under 35 U.S.C. 154(b) by 1 day.

(21) Appl. No.: 10/268,761

(22) Filed: Oct. 11, 2002

(65) Prior Publication Data

US 2003/0096191 A1 May 22, 2003

(30) Foreign Application Priority Data

Oct. 12, 2001 (JP) .......................................... 2001-314863

(51) Int. Cl.[7] .............................................. G03F 7/023
(52) U.S. Cl. ...................... 430/190; 430/191; 430/192; 430/193; 430/326; 525/487
(58) Field of Search ................................ 430/190, 191, 430/192, 193, 326; 525/487

(56) References Cited

U.S. PATENT DOCUMENTS

| | | | |
|---|---|---|---|
| 4,594,306 A | 6/1986 | Stahlhofen et al. | |
| 6,210,811 B1 * | 4/2001 | Honda et al. | 428/620 |
| 6,337,363 B1 * | 1/2002 | Lee et al. | 523/466 |
| 2003/0059706 A1 * | 3/2003 | Misumi et al. | 430/190 |

FOREIGN PATENT DOCUMENTS

| | | |
|---|---|---|
| GB | 1297264 | 4/1969 |
| GB | 1 514 552 | 8/1975 |
| JP | 48-3616 | 2/1973 |
| JP | 51-52002 | 5/1976 |
| JP | 53-39115 | 4/1978 |
| JP | 53-54503 A | 5/1978 |
| JP | 2000-44876 A | 2/2000 |
| JP | 2000-56453 A | 2/2000 |

* cited by examiner

*Primary Examiner*—John S. Chu
(74) *Attorney, Agent, or Firm*—Birch, Stewart, Kolasch & Birch, LLP

(57) ABSTRACT

A phenolic resin/silicone resin hybrid compound is obtained by effecting hydrolytic condensation of an organooxysilane in the co-presence of a phenolic resin. The hybrid compound is used as the base polymer in a resist for endowing a resist film with excellent adhesion to a metal substrate.

13 Claims, No Drawings

HYBRID COMPOUND, RESIST, AND PATTERNING PROCESS

BACKGROUND OF THE INVENTION

1. Field of the Invention

The present invention relates to a silicone resin/phenolic resin hybrid compound in which a silicone resin component is dispersed within a phenolic resin at a molecular level and the silicone resin component and phenolic resin are interlocked in a network-like manner. The invention also relates to a resist containing the hybrid compound, and to a patterning process which uses the resist.

2. Prior Art

The use of novolac resin-containing organic-inorganic polymer hybrids as resists and a method for the preparation of such hybrids are described in JP-A 2000-44876 and JP-A 2000-56453. Resists of this type purportedly enhance the heat resistance of the resist film, making it less subject to deformation, and also improve the dry etching resistance of the film.

In semiconductor integrated circuit applications, the substrate to which the resist is applied generally is a silicon wafer. Lately, however, a variety of applications are being proposed which call for the use of resists on not only silicon substrates, but also metal substrates such as copper, gold, aluminum, chromium, titanium and tantalum substrates. The resist film must have the ability to adhere to such metal substrates.

Methods for improving adhesion of the resist to the substrate include, in particular, the incorporation of an additive, such as that obtained by adding an organic hydroperoxide to an N-substituted imide (JP-B 48-3616), the addition of an aminoalkoxysilane (JP-A 51-52002), the addition of a chelate complex-forming hydroxyl group-bearing aromatic or aliphatic compound (JP-A 52-54503), and the addition of a silane coupling agent (JP-A 53-39115). However, the use of any of these compounds as an additive includes among its drawbacks the risk of inducing microphase separation, depending on the compatibility of the additive with the other resist components.

SUMMARY OF THE INVENTION

It is therefore an object of the present invention to provide a hybrid compound which is highly suitable for use as the base polymer in a resist and which imparts the resist with good adhesion to substrates, especially metal substrates. Another object of the invention is to provide a resist containing such a hybrid compound. A further object of the invention is to provide a patterning process that makes use of such a resist.

We have found that the use of a silicone resin/phenolic resin hybrid compound wherein a silicone resin component is dispersed within a phenolic resin at the molecular level and the phenolic resin and silicone resin component are interlocked in a network-like manner enables the dispersed silicone resin component to form complexes with various metals and their oxide film molecules, thereby enhancing adhesion.

Accordingly, the invention provides a hybrid compound which includes a phenolic resin and a silicone resin prepared by the hydrolysis and condensation of an organooxysilane of the general formula (1):

$$R^1{}_n Si(OR^2)_{4-n} \quad (1)$$

wherein $R^1$ is a sulfur- or oxygen-bearing monovalent hydrocarbon group, $R^2$ represents a monovalent hydrocarbon group, and n is 1 or 2.

In the hybrid compound, the phenolic resin is preferably a novolac resin comprising recurring units of the general formula (2):

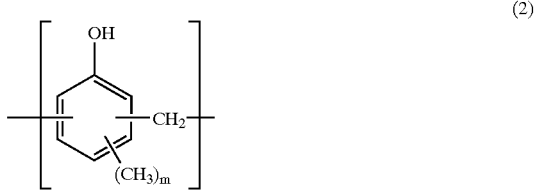

wherein m is an integer from 0 to 3, which has a polystyrene equivalent weight-average molecular weight of 1,000 to 10,000, and in which 1 to 50 mol % of the hydroxyl group hydrogens are substituted with 1,2-naphthoquinonediazidosulfonyl ester groups.

The invention also provides a resist comprising the foregoing hybrid compound.

The invention further provides a patterning process which includes the steps of (i) applying the foregoing resist to a substrate, (ii) exposing the applied resist through a photomask to light having a wavelength of 150 to 450 nm, and (iii) developing the exposed resist with a liquid developer.

DETAILED DESCRIPTION OF THE INVENTION

The silicone resin/phenolic resin hybrid compound of the invention is a compound obtained by adding an organooxysilane of the general formula (1):

$$R^1{}_n Si(OR^2)_{4-n} \quad (1)$$

to a phenolic resin, then subjecting the organooxysilane to a sol-gel reaction via hydrolysis and condensation. In the compound, the silicone resin derived from the organooxysilane is interlocked with the phenolic resin in a network-like manner.

In above general formula (1), $R^1$ is a sulfur- or oxygen-bearing monovalent hydrocarbon group, $R^2$ represents a monovalent hydrocarbon group, and the letter n is 1 or 2. Illustrative examples of sulfur-bearing monovalent hydrocarbon groups that may serve as $R^1$ include mercapto group-containing $C_{1-8}$ alkyls such as mercaptomethyl, mercaptoethyl, mercaptopropyl, mercaptobutyl, mercaptopentyl, mercaptohexyl, mercaptobutyl and mercaptooctyl; mercapto group-containing $C_{6-10}$ aryls such as mercaptophenyl and mercaptomethylphenyl; and mercapto group-containing $C_{7-12}$ aralkyls such as mercaptobenzyl, mercaptomethylbenzyl and 2-phenyl-1-mercaptoethyl.

Illustrative examples of oxygen-bearing monovalent hydrocarbon groups that may serve as $R^1$ include glycidoxy or epoxy group-containing $C_{4-8}$ alkyls such as glycidoxymethyl, glycidoxyethyl, glycidoxypropyl, glycidoxybutyl, glycidoxypentyl and (3,4-epoxycyclohexyl) ethyl; and methacryloxy group-containing $C_{4-8}$ alkyls such as methacryloxymethyl, methacryloxyethyl, methacryloxypropyl and methacryloxybutyl.

Illustrative examples of the monovalent hydrocarbon groups represented in the above formula as $R^2$ include $C_{1-8}$ alkyls, $C_{6-10}$ aryls such as phenyl and tolyl, and $C_{7-12}$ aralkyls such as benzyl and phenylethyl.

Phenolic resins that may be used in the invention include substituted or unsubstituted novolac resins and polyhydroxystyrene resins. Preferable use can be made of a novolac resin which has recurring units of the general formula (2):

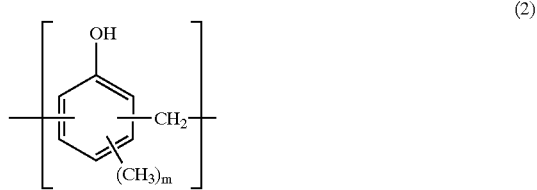

(2)

wherein m is an integer from 0 to 3, which has a polystyrene equivalent weight-average molecular weight of 1,000 to 10,000, and in which 1 to 50 mol %, especially 3 to 30 mol % of the hydroxyl group hydrogens are substituted with 1,2-naphthoquinonediazidosulfonyl ester groups.

If the novolac resin includes photosensitive groups as substituents, the photosensitive groups are preferably, though not necessarily, naphthoquinonediazide groups.

The silicone resin/phenolic resin hybrid compound of the invention can be prepared by the following method.

A phenolic resin is dissolved in an alcohol having 1 to 8 carbons, such as methanol or ethanol. An organooxysilane component of above general formula (1) is added to the resulting solution, and a sol-gel reaction is carried out via hydrolysis and condensation in the presence of water. An acid such as hydrochloric acid or p-toluenesulfonic acid may be added as the catalyst, although acid addition is not always necessary because the hydroxyl groups on the phenolic resin are intrinsically acidic. The organooxysilane of above formula (1) is used in an amount of preferably 1 to 60 wt %, and most preferably 3 to 50 wt %, based on the phenolic resin. At less than 1 wt % of the organooxysilane, it may be impossible to achieve the object of the invention. On the other hand, an organooxysilane content of more than 60 wt % may greatly compromise the uniformity of application and the resolution of the resist.

The sol-gel reaction may be carried out by an ordinary method for the hydrolysis and condensation of organooxysilane, although reaction at a temperature of 20 to 80° C., and especially 30 to 60° C., for a period of 0.5 to 5 hours, and especially 1 to 3 hours, is preferred.

Following the reaction, the product can be used as a resist component once the alcohol that has formed in the reaction and excess water have been removed by distillation. Such removal of alcohol and water is preferably carried out by vacuum distillation at a temperature of less than 40° C. If the organooxysilane contains photosensitive substituents such as naphthoquinonediazide groups, raising the temperature too high may lead to decomposition of the naphthoquinonediazide groups, resulting in a loss of the desired characteristics in resists containing the hybrid compound.

The silicone resin/phenolic resin hybrid compound of the invention can be used as a resist. However, in resists containing the inventive silicone resin/phenolic resin hybrid compound, it is preferable for the hybrid compound to be present in an amount of 1 to 60 wt %, and especially 3 to 50 wt %, of the resist solids other than the hybrid compound. The presence of less than 1 wt % may prevent the objects of the invention from being achieved, whereas more than 60 wt % may have a very detrimental effect on the uniformity of application and the resolution of the resist.

Resists containing this silicone resin/phenolic resin hybrid compound may also include a photosensitizer. The photosensitizer used for this purpose is preferably a 1,2-quinonediazide compound, illustrative, non-limiting examples of which include 1,2-naphthoquinonediazido-4-sulfonic acid esters and 1,2-naphthoquinonediazido-5-sulfonic acid esters.

The amount of photosensitizer included in the resist is preferably 5 to 50 parts by weight, and most preferably 10 to 40 parts by weight, per 100 parts by weight of the silicone resin/phenolic resin hybrid compound.

In cases where the silicone resin/phenolic resin hybrid compound of the invention is employed as a resist, the resist is typically used as a solution in an organic solvent. Any organic solvent in which the resist is fully soluble and which confers a good film-forming ability may be used for this purpose. Examples of suitable organic solvents include cellosolve solvents such as methyl cellosolve, ethyl cellosolve, methyl cellosolve acetate and ethyl cellosolve acetate; propylene glycol solvents such as propylene glycol monomethyl ether, propylene glycol monobutyl ether, propylene glycol monomethyl ether acetate, propylene glycol dimethyl ether and propylene glycol monoethyl ether acetate; ester solvents such as butyl acetate, amyl acetate, methyl lactate, ethyl lactate, ethyl 3-methoxypropionate and ethyl 3-ethoxypropionate; alcohol solvents such as hexanol and diacetone alcohol; ketone solvents such as cyclohexanone and methyl amyl ketone; ether solvents such as methyl phenyl ether and diethylene glycol dimethyl ether; highly polar solvents such as N,N-dimethylformamide and N-methyl-pyrrolidone; and mixtures of any of the above. The amount of solvent used is preferably 1 to 20 times, and most preferably 1 to 15 times, the weight of the silicone resin/phenolic resin hybrid compound.

Apart from the above photosensitizer and solvent, the resist of the invention may include also such additives as leveling agents, various types of surfactants, and dyes.

A known lithographic process may be used to pattern the resist of the invention. For example, the resist is typically spin-coated or otherwise applied to a substrate such as a silicon wafer, then pre-exposure baked on a hot plate at 60 to 150° C. for 1 to 10 minutes, and preferably at 80 to 120° C. for 1 to 5 minutes, so as to give a resist film having a thickness of 0.5 to 2.0 µm.

Next, the resist film is exposed, through a patterning mask held over it, to about 1 to 200 mJ/cm², and preferably about 1 to 100 mJ/cm², of sub-500 nm wavelength high-energy radiation or electron beams. If necessary, the resist film is then post-exposure baked on a hot plate at 60 to 150° C. for 1 to 10 minutes, and preferably at 80 to 120° C. for 1 to 5 minutes. The exposed resist is then developed by an ordinary method, such as a dip, paddle or spray process, for a period of 0.1 to 3 minutes, and preferably 0.5 to 2 minutes, using an aqueous alkali solution such as 0.1 to 5 wt %, and preferably 2 to 3 wt %, tetramethylammonium hydroxide (TMAH), thereby forming the desired pattern on the substrate.

EXAMPLES

Examples of the invention and comparative examples are given below by way of illustration and not by way of limitation.

Synthesis Example 1

Preparation of Novolac Resin

A three-necked flask equipped with a stirrer, a condenser and a thermometer was charged with 59.5 g (0.55 mol) of p-cresol, 48.7 g (0.45 mol) of m-cresol, 48.7 g (0.52 mol) of a 37 wt % formaldehyde solution in water, and 0.30 g ($2.40 \times 10^{-3}$ mol) of the polycondensation catalyst oxalic acid dehydrate. The flask was then immersed in an oil bath and polycondensation carried out for one hour while maintaining the internal temperature at 100° C. Following reaction completion, 500 ml of methyl isobutyl ketone (MIBK) was added to the reaction mixture and stirring carried out for 30 minutes. The aqueous layer was removed, after which the reaction product that had been extracted into the MIBK layer was washed five times with 300 ml of pure water and the water discarded. Vacuum stripping at 4 mmHg and 150° C. in an evaporator yielded 87 g of an alkali-soluble novolac resin A.

Synthesis Example 2

Preparation of 1,2-Naphthoquinonediazidosulfonyl Ester Group-Substituted Novolac Resin Under darkened conditions, a three-necked flask equipped with a stirrer, a condenser and a thermometer was charged with 120 g (1 mol) of the alkali-soluble novolac resin A obtained in Synthesis Example 1, 26.9 g (0.10 mol) of 1,2-naphthoquinonediazidosulfonyl chloride and 400 g of acetone, and the flask contents were stirred for one hour to effect dissolution. The flask was then immersed in a water bath adjusted to 25° C., and 10.6 g (0.11 mol) of triethylamine was added dropwise in such a way that the internal temperature did not exceed 30° C. The reaction mixture was aged for one hour, then poured into 5,000 ml of 0.1 N hydrochloric acid in water. The precipitate that formed was collected by filtration and dissolved in 800 g of methyl isobutyl ketone, after which the solution was washed with water and the water discarded. Vacuum stripping at 40° C. yielded 142 g of a novolac resin B in which 10 mol % of the hydroxyl group hydrogens on the original novolac resin A were substituted with 1,2-naphthoquinonedizidosulfonyl ester groups.

Example 1

Methanol (10 ml) and 1.2 g of γ-glycidoxypropyltriethoxysilane were added to 4 g of novolac resin B obtained in Synthesis Example 2, and the ingredients were stirred to effect dissolution. Next, 1.5 ml of pure water was added dropwise to the solution, under stirring, with a dropping funnel over a period of about 5 minutes. Following dropwise addition, the reaction mixture was aged for one hour, then the methanol solvent, the ethanol that formed in the reaction and excess water were removed by vacuum distillation at 40° C. and 2 mmHg in a rotary evaporator, yielding 5 g of product.

The product was dissolved, together with 0.01 g of the surfactant X-70-093 (trade name, produced by Shin-Etsu Chemical Co., Ltd.), in 5 g of propylene glycol monomethyl ether acetate. The resulting solution was passed through a membrane filter having a pore size of 0.2 μm, giving 10 g of a resist A composed primarily of a silicone resin/novolac resin hybrid compound.

Resist A was applied with a spinner to a substrate composed of a 6-inch bare silicon wafer onto which chromium had been sputtered, and the resist-coated substrate was pre-baked on a hot plate at 100° C. for 120 seconds to form a 6.0 μm thick resist film. The resist film was exposed using an i-line stepper (NSR-1755i7, made by Nikon Corporation; NA=0.5), developed, and rinsed with pure water. Pattern evaluation was subsequently carried out by examining a pattern of 1.5 μm lines and spaces under a scanning electron microscope (Hitachi, Ltd.). Adhesion of the film to the substrate was rated based on the presence or absence of pattern flow.

Example 2

Following the same procedure as in Example 1, 10 ml of methanol and 1.6 g of γ-methacryloxypropyltrimethoxysilane were added to 4 g of novolac resin B obtained in Synthesis Example 2, and the ingredients were stirred to effect dissolution. Next, 2 ml of pure water was added dropwise to the solution, under stirring, with a dropping funnel over a period of about 5 minutes. Following dropwise addition, the reaction mixture was aged for one hour, then the methanol solvent, the ethanol that formed in the reaction and excess water were removed by vacuum distillation at 40° C. and 2 mmHg in a rotary evaporator, yielding 5.2 g of product.

As in Example 1, the product was dissolved, together with 0.01 g of the surfactant X-70-093, in 5 g of propylene glycol monomethyl ether acetate. The resulting solution was passed through a membrane filter having a pore size of 0.2 μm, giving 10 g of a resist B composed primarily of a silicone resin/novolac resin hybrid compound. Resist B was then spun onto a substrate composed of a 6-inch bare silicon wafer onto which tantalum had been sputtered. Adhesion of the resulting resist film to the substrate was rated in the same way as in Example 1.

Example 3

Following the same procedure as in Example 1, 10 ml of methanol and 0.8 g of γ-mercaptopropyltrimethoxysilane were added to 4 g of novolac resin B obtained in Synthesis Example 2, and the ingredients were stirred to effect dissolution. Next, 2 ml of pure water was added dropwise to the solution, under stirring, with a dropping funnel over a period of about 5 minutes. Following dropwise addition, the reaction mixture was aged for one hour, then the methanol solvent, the ethanol that formed in the reaction and excess water were removed by vacuum distillation at 40° C. and 2 mmHg in a rotary evaporator, yielding 4.6 g of product.

As in Example 1, the product was dissolved, together with 0.01 g of the surfactant X-70-093, in 5 g of propylene glycol monomethyl ether acetate. The resulting solution was passed through a membrane filter having a pore size of 0.2 μm, giving 10 g of a resist C composed primarily of a silicone resin/novolac resin hybrid compound. Resist C was then spun onto a substrate composed of a 6-inch bare silicon wafer onto which gold had been sputtered. Adhesion of the resulting resist film to the substrate was rated in the same way as in Example 1.

Example 4

Methanol (10 ml) and 1.2 g of γ-glycidoxypropyltriethoxysilane were added to 4 g of novolac resin A obtained in Synthesis Example 1, and the ingredients were stirred to effect dissolution. Next, 1.5 ml of pure water was added dropwise to the solution, under stirring, with a dropping funnel over a period of about 5 minutes. Following dropwise addition, the reaction mixture was aged for one hour, then the methanol solvent, the ethanol that formed in the reaction and excess water were removed by vacuum distillation at 40° C. and 2 mmHg in a rotary evaporator, yielding 5 g of product.

Following the same procedure as in Example 1, the product was dissolved, together with 0.01 g of the surfactant X-70-093 and 1.5 g of a photosensitizer P of the following the general formula

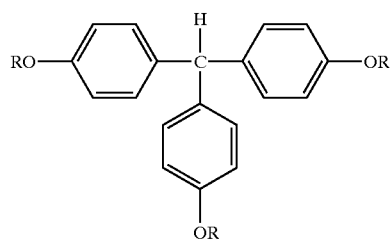

(3)

(wherein R represents a hydrogen or a 1,2-naphthoquinone-diazido-5-sulfonyl group, and two of the R groups, on average, are 1,2-naphthoquinondiazido-5-sulfonyl groups), in 5 g of propylene glycol monomethyl ether acetate. The resulting solution was passed through a membrane filter having a pore size of 0.2 μm, giving 10 g of a resist D composed primarily of a silicone resin/novolac resin hybrid compound. Resist D was then spun onto a substrate composed of a 6-inch bare silicon wafer onto which chromium had been sputtered. Adhesion of the resulting resist film to the substrate was rated in the same way as in Example 1.

Example 5

Following the same procedure as in Example 4, 10 ml of methanol and 1.6 g of γ-methacryloxypropyltrimethoxysilane were added to 4 g of novolac resin A obtained in Synthesis Example 1, and the ingredients were stirred to effect dissolution. Next, 2 ml of pure water was added dropwise to the solution, under stirring, with a dropping funnel over a period of about 5 minutes. Following dropwise addition, the reaction mixture was aged for one hour, then the methanol solvent, the ethanol that formed in the reaction and excess water were removed by vacuum distillation at 40° C. and 2 mmHg in a rotary evaporator, yielding 5.2 g of product.

As in Example 1, the product was dissolved, together with 0.01 g of the surfactant X-70-093 and 1.5 g of the photosensitizer P of above general formula (3), in 5 g of propylene glycol monomethyl ether acetate. The resulting solution was passed through a membrane filter having a pore size of 0.2 μm, giving 10 g of a resist E composed primarily of a silicone resin/novolac resin hybrid compound. Resist E was then spun onto a substrate composed of a 6-inch bare silicon wafer onto which tantalum had been sputtered. Adhesion of the resulting resist film to the substrate was rated in the same way as in Example 1.

Example 6

Following the same procedure as in Example 4, 10 ml of methanol and 0.8 g of γ-mercaptopropyltrimethoxysilane were added to 4 g of novolac resin A obtained in Synthesis Example 1, and the ingredients were stirred to effect dissolution. Next, 1.2 ml of pure water was added dropwise to the solution, under stirring, with a dropping funnel over a period of about 5 minutes. Following dropwise addition, the reaction mixture was aged for one hour, then the methanol solvent, the ethanol that formed in the reaction and excess water were removed by vacuum distillation at 40° C. and 2 mmHg in a rotary evaporator, yielding 4.6 g of product.

As in Example 1, the product was dissolved, together with 0.01 g of the surfactant X-70-093, in 5 g of propylene glycol monomethyl ether acetate. The resulting solution was passed through a membrane filter having a pore size of 0.2 μm, giving 10 g of a resist F composed primarily of a silicone resin/novolac resin hybrid compound. Resist F was then spun onto a substrate composed of a 6-inch bare silicon wafer onto which gold had been sputtered. Adhesion of the resulting resist film to the substrate was rated in the same way as in Example 1.

Comparative Example 1

Following the same procedure as in Example 1, 10 ml of methanol and 1.2 g of phenyltriethoxysilane were added to 4 g of novolac resin B obtained in Synthesis Example 2, and the ingredients were stirred to effect dissolution. Next, 1.5 ml of pure water was added dropwise to the solution, under stirring, with a dropping funnel over a period of about 5 minutes. Following dropwise addition, the reaction mixture was aged for one hour, then the methanol solvent, the ethanol that formed in the reaction and excess water were removed by vacuum distillation at 40° C. and 2 mmHg in a rotary evaporator, yielding 5 g of product.

As in Example 1, the product was dissolved, together with 0.01 g of the surfactant X-70-093, in 5 g of propylene glycol monomethyl ether acetate. The resulting solution was passed through a membrane filter having a pore size of 0.2 μm, giving 10 g of a resist G composed primarily of a silicone resin/novolac resin hybrid compound. Resist G was then spun onto a substrate composed of a 6-inch bare silicon wafer onto which chromium had been sputtered. Adhesion of the resulting resist film to the substrate was rated in the same way as in Example 1.

Comparative Example 2

Following the same procedure as in Example 4, 10 ml of methanol and 1.2 g of phenyltriethoxysilane were added to 4 g of novolac resin A obtained in Synthesis Example 1, and the ingredients were stirred to effect dissolution. Next, 1.5 ml of pure water was added dropwise to the solution, under stirring, with a dropping funnel over a period of about 5 minutes. Following dropwise addition, the reaction mixture was aged for one hour, then the methanol solvent, the ethanol that formed in the reaction and excess water were removed by vacuum distillation at 40° C. and 2 mmHg in a rotary evaporator, yielding 5 g of product.

As in Example 1, the product was dissolved, together with 0.01 g of the surfactant X-70-093, in 5 g of propylene glycol monomethyl ether acetate. The resulting solution was passed through a membrane filter having a pore size of 0.2 μm, giving 10 g of a resist H composed primarily of a silicone resin/novolac resin hybrid compound. Resist H was then spun onto a substrate composed of a 6-inch bare silicon wafer onto which tantalum had been sputtered. Adhesion of the resulting resist film to the substrate was rated in the same way as in Example 1.

TABLE 1

| | Silicone resin/ novolac hybrid compound | Organooxysilane | Substrate surface metal | Adhesion (1.5 μm l/s) |
|---|---|---|---|---|
| Example 1 | A | γ-glycidoxypropyltriethoxysilane | chromium | no pattern flow |
| Example 2 | B | γ-methacryloxypropyltrimethoxysilane | tantalum | no pattern flow |
| Example 3 | C | γ-mercaptopropyltrimethoxysilane | gold | no pattern flow |
| Example 4 | D | γ-glycidoxypropyltriethoxysilane | chromium | no pattern flow |
| Example 5 | E | γ-methacryloxypropyltrimethoxysilane | tantalum | no pattern flow |
| Example 6 | F | γ-mercaptopropyltrimethoxysilane | gold | no pattern flow |
| Comparative Example 1 | G | phenyltriethoxysilane | chromium | some pattern flow |
| Comparative Example 2 | H | phenyltriethoxysilane | tantalum | some pattern flow |

As is apparent from the above results, the invention provides hybrid compounds which, when used as the base polymer in a resist, confer a film of the resist formed on a metal substrate with excellent adhesion to the substrate.

Japanese Patent Application No. 2001-314863 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claim is:

1. A hybrid compound comprising:
   a phenolic resin, wherein the phenolic resin is a novolac resin comprising recurring units of the general formula (2):

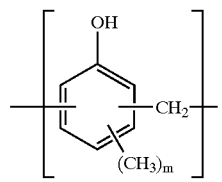

wherein m is an integer from 0 to 3, which has a polystyrene equivalent weight-average molecular weight of 1,000 to 10,000, and in which 1 to 50 mol % of the hydroxyl group hydrogens are substituted with 1,2-naphthoquinonediazidosulfonyl ester groups, and a silicone resin prepared by the hydrolysis and condensation of an organooxysilane of the general formula (1):

$$R^1{}_n Si(OR^2)_{4-n} \quad (1)$$

wherein $R^1$ is a sulfur- or oxygen-bearing monovalent hydrocarbon group, $R^2$ represents a monovalent hydrocarbon group, and n is 1 or 2.

2. A resist comprising a hybrid compound comprising:
   a phenolic resin, and
   a silicone resin prepared by the hydrolysis and condensation of an organooxysilane of the general formula (1):

$$R^1{}_n Si(OR^2)_{4-n} \quad (1)$$

wherein $R^1$ is a sulfur- or oxygen-bearing monovalent hydrocarbon group, $R^2$ represents a monovalent hydrocarbon group, and n is 1 or 2.

3. A patterning process comprising the steps of:
   (i) applying the resist of claim 2 to a substrate,
   (ii) exposing the applied resist through a photomask to light having a wavelength of 150 to 450 nm, and
   (iii) developing the exposed resist with a liquid developer.

4. The resist according to claim 2 wherein in said hybrid compound, the phenolic resin is a novolac resin comprising recurring units of the general formula (2):

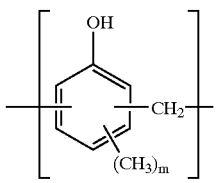 (2)

wherein m is an integer from 0 to 3, which has a polystyrene equivalent weight-average molecular weight of 1,000 to 10,000, and in which 1 to 50 mol % of the hydroxyl group hydrogens are substituted with 1,2-naphthoquinonediazidosulfonyl ester groups.

5. The hybrid compound according to claim 1, wherein $R^1$ is a sulfur-bearing monovalent hydrocarbon group.

6. The hybrid compound according to claim 5, wherein said sulfur-bearing monovalent hydrocarbon group is selected from the group consisting of mercapto group-containing $C_{1-8}$ alkyls, mercapto group-containing $C_{6-10}$ aryls, and mercapto group-containing $C_{7-12}$ aralkyls.

7. The hybrid compound according to claim 6, wherein said mercapto group-containing $C_{1-8}$ alkyls are selected from the group consisting of mercaptomethyl, mercaptoethyl, mercaptopropyl, mercaptobutyl, mercaptopentyl, mercaptohexyl, mercaptobutyl and mercaptooctyl, said mercapto group-containing $C_{6-10}$ aryls are selected from the group consisting of mercaptophenyl and mercaptomethylphenyl, and said mercapto group-containing $C_{7-12}$ aralkyls are selected from the group consisting of mercaptobenzyl, mercaptomethylbenzyl and 2-phenyl-1-mercaptoethyl.

8. The hybrid compound according to claim 1, wherein $R^1$ is an oxygen-bearing monovalent hydrocarbon group.

9. The hybrid compound according to claim 8, wherein said oxygen-bearing monovalent hydrocarbon group is selected from the group consisting of glycidoxy group-containing $C_{4-8}$ alkyls, epoxy group-containing $C_{4-8}$ alkyls, and methacryloxy group-containing $C_{4-8}$ alkyls.

10. The hybrid compound according to claim 9, wherein said glycidoxy group-containing $C_{4-8}$ alkyls are selected from the group consisting of glycidoxyrmethyl, glycidoxyethyl, glycidoxypropyl, glycidoxybutyl and glycidoxypentyl, said epoxy group-containing $C_{4-8}$ alkyl is (3,4-epoxycyclohexyl), and said methacryloxy group-containing $C_{4-8}$ alkyls are selected from the group consisting of methacryloxymethyl, methacryloxyethyl, methacryloxypropyl and methacryloxybutyl.

11. The hybrid compound according to claim 1, wherein $R^2$ is selected from the group consisting of $C_{1-8}$ alkyls, $C_{6-10}$ aryls, and $C_{7-12}$ aralkyls.

12. The hybrid compound according to claim 11, wherein said $C_{6-10}$ aryls are phenyl or tolyl, and said $C_{7-12}$ aralkyls are benzyl or phenylethyl.

13. The hybrid compound according to claim 1, wherein in said phenolic resin, 3 to 30 mol % of the hydroxyl group hydrogens are substituted with 1,2-naphthoquinonediazidosulfonyl ester groups.

* * * * *